United States Patent
Lin et al.

(10) Patent No.: US 9,601,676 B2
(45) Date of Patent: Mar. 21, 2017

(54) LED SUPPORT ASSEMBLY AND LED MODULE

(71) Applicant: BYD COMPANY LIMITED, Shenzhen, Guangdong (CN)

(72) Inventors: Xinping Lin, Guangdong (CN); Qiang Xu, Guangdong (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 14/891,146

(22) PCT Filed: Jun. 24, 2014

(86) PCT No.: PCT/CN2014/080581
§ 371 (c)(1),
(2) Date: Nov. 13, 2015

(87) PCT Pub. No.: WO2014/206269
PCT Pub. Date: Dec. 31, 2014

(65) Prior Publication Data
US 2016/0118565 A1 Apr. 28, 2016

(30) Foreign Application Priority Data

Jun. 27, 2013 (CN) .......................... 2013 2 0375705

(51) Int. Cl.
*H01L 33/64* (2010.01)
*H01L 33/36* (2010.01)
(Continued)

(52) U.S. Cl.
CPC ............ *H01L 33/641* (2013.01); *H01L 33/36* (2013.01); *H01L 33/52* (2013.01); *H01L 33/642* (2013.01);
(Continued)

(58) Field of Classification Search
USPC .......................................... 257/99
See application file for complete search history.

(56) References Cited

U.S. PATENT DOCUMENTS

| 4,926,242 A * | 5/1990 | Itoh ...................... C22C 1/0416 165/905 |
| 6,184,463 B1 * | 2/2001 | Panchou ................. H01L 22/00 174/548 |

(Continued)

FOREIGN PATENT DOCUMENTS

| CN | 2879427 Y | 3/2007 |
| CN | 101702424 A | 5/2010 |

(Continued)

OTHER PUBLICATIONS

International Search Report From PCT/CN2014/080581 Dated Sep. 5, 2014.

*Primary Examiner* — Thao P Le
(74) *Attorney, Agent, or Firm* — Calfee, Halter & Griswold LLP

(57) ABSTRACT

An LED support assembly and an LED module are provided. The LED support assembly includes: a metal heat sink, a first ceramic substrate and a second ceramic substrate, the metal heat sink defines an upper surface; the first ceramic substrate is adapted to support a LED chip and disposed on the upper surface of the metal heat sink; the second ceramic substrate is adapted to support electrodes of the LED chip and surrounds the first ceramic substrate.

14 Claims, 1 Drawing Sheet

(51) Int. Cl.
*H01L 33/52* (2010.01)
*H01L 33/54* (2010.01)
*H01L 33/58* (2010.01)

(52) U.S. Cl.
CPC ............. *H01L 33/54* (2013.01); *H01L 33/58* (2013.01); *H01L 33/644* (2013.01); *H01L 2224/48091* (2013.01); *H01L 2224/8592* (2013.01)

(56) References Cited

U.S. PATENT DOCUMENTS

| | | | |
|---|---|---|---|
| 2002/0175621 A1* | 11/2002 | Song | H01L 33/641 |
| | | | 313/515 |
| 2005/0161682 A1* | 7/2005 | Mazzochette | H01L 25/0753 |
| | | | 257/79 |
| 2010/0103623 A1* | 4/2010 | Kwank | H01L 23/13 |
| | | | 361/709 |
| 2011/0140260 A1* | 6/2011 | Bonthron | H01L 23/04 |
| | | | 257/690 |

FOREIGN PATENT DOCUMENTS

| | | |
|---|---|---|
| CN | 201904333 U | 7/2011 |
| CN | 102790162 A | 11/2012 |
| CN | 203377255 U | 1/2014 |
| JP | 2005123457 A | 5/2012 |
| WO | 9613056 A2 | 5/1996 |

\* cited by examiner

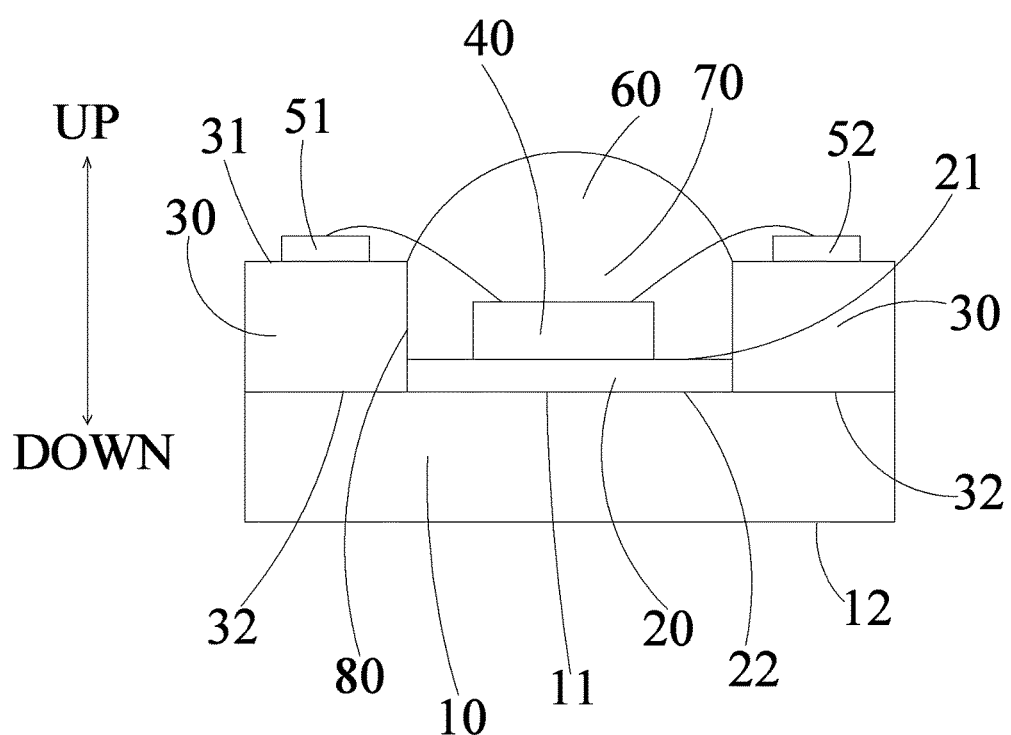

LED SUPPORT ASSEMBLY AND LED MODULE

CROSS-REFERENCE TO RELATED APPLICATION

This application is the U.S. national phase entry of PCT/CN2014/080581, with an international filing date of 24 Jun. 2014, which claims the benefit of Chinese Application Serial No. 201320375705.2, with a filing date of 27 Jun. 2013, the entire disclosures of which are fully incorporated herein by reference.

FIELD

Exemplary embodiments of the present disclosure relate generally to a light emitting diode (LED) modules field, and more particularly to an LED support assembly and an LED module having the same.

BACKGROUND

In order to solve the problem of poor heat dissipation existed in the conventional LED module, the means of FR-4 printing plate, metal core PCB (MCPCB), and ceramic PCB are used to radiate heat. In which, the thermal conductivity of FR-4 is smaller than 1 W/m*K, the thermal conductivity of MCPCB is about 2 to 3 W/m*K, on the other hand, the thermal conductivity of aluminum oxide ceramic is 25 W/m*K. It can be seen that the ceramic PCB has a relatively high thermal conductivity, thus, the technologies, such as ceramic mixing circuit (HIC), low temperature co-fired ceramic (LTCC), high temperature co-fired ceramic (HTCC), direct bonding copper (DBC), and direct plating copper method (DPC), are wildly used for manufacturing of the LED module.

The circuit is usually formed on the surface of the ceramic substrate with a thinner thickness, so that the heat generated by the LED can be rapidly and efficiently transferred from the LED to the heat sink via the ceramic substrate. However, the ceramic substrate with the thinner thickness is easily broken in practice due to the poor mechanical strength thereof.

SUMMARY

Embodiments of the present disclosure seek to solve at least one of the problems.

According to a first aspect of the present disclosure, an LED support assembly having excellent performance of heat dissipation and mechanical strength is provided. The LED support assembly includes: a metal heat sink defining an upper surface and a lower surface; a first ceramic substrate adapted to support a LED chip and disposed on the upper surface of the metal heat sink; and a second ceramic substrate adapted to support electrodes of the LED chip and surrounding the first ceramic substrate.

In some embodiments, the second ceramic substrate defines a hole penetrating through the second ceramic substrate in a thickness direction thereof, the first ceramic substrate is disposed in the hole and a mounting cavity is defined by the first and second ceramic substrates.

In some embodiments, a thickness of the first ceramic substrate is smaller than that of the second ceramic substrate.

In some embodiments, the thickness of the first ceramic substrate ranges from 0.1 mm to 0.6 mm, and the thickness of the second ceramic substrate ranges from 0.6 mm to 5 mm.

In some embodiments, an area of the lower surface of the first ceramic substrate is smaller than that of the upper surface of the metal heat sink In some embodiments, the second ceramic substrate is disposed on the upper surface of the metal heat sink.

In some embodiments, a sum of an area of the lower surface of the first ceramic substrate and a lower surface of the second ceramic substrate is smaller than an area of the upper surface of the metal heat sink.

In some embodiments, a thermal conductivity of the first ceramic substrate is higher than that of the second ceramic substrate.

In some embodiments, a coefficient of thermal expansion of the first ceramic substrate is lower than that of the second ceramic substrate.

In some embodiments, a strength coefficient of the first ceramic substrate is lower than that of the second ceramic substrate.

In some embodiments, the first ceramic substrate is made of at least one of aluminum oxide ceramics, aluminum nitride ceramics, zirconium oxide ceramics, and beryllium oxide ceramics.

In some embodiments, the second ceramic substrate is made of at least one of aluminum nitride ceramics and zirconium oxide ceramics.

In some embodiments, the metal heat sink is copper heat sink.

According to a second aspect of the present disclosure, an LED module is provided. The LED module includes an LED support assembly; an LED chip supported on the first ceramic substrate of the LED support assembly; a positive electrode and a negative electrode which are supported on the second ceramic substrate and electrically connected to the LED chip respectively and a sealing material encapsulating the LED chip.

With the LED support assembly of the present disclosure, a conflict between the thermal conductivity and the mechanical strength is solved. For example, a thinner ceramic substrate (the first ceramic substrate) can ensure the performance of heat dissipation, and a thicker ceramic substrate (the second ceramic substrate) is used to reinforce the mechanical strength. Moreover, the resin is easily to be filled into the mounting cavity formed by the first and second ceramic substrates, so as to improve the quality of LED chip encapsulation. Finally, the materials of the first and second ceramic substrates are different, so as to save the cost.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which:

FIG. 1 is a schematic view of an LED module according to an embodiment of the present disclosure.

DETAILED DESCRIPTION

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

It is to be understood that phraseology and terminology used herein with reference to device or element orientation (such as, terms like "longitudinal", "lateral", "up", "down", "front", "rear", "left", "right", "vertical", "horizontal", "top", "bottom", "inside", "outside") are only used to simplify description of the present disclosure, and do not indicate or imply that the device or element referred to must have or operated in a particular orientation. They cannot be seen as limits to the present disclosure.

In the description, terms concerning attachments, coupling and the like, such as "connected" and "interconnected", refer to a relationship in which structures are secured or attached to one another through mechanical or electrical connection, or directly or indirectly through intervening structures, unless expressly described otherwise. Specific implications of the above phraseology and terminology may be understood by those skilled in the art according to specific situations.

As described in the BACKGROUND, in order to ensure the mechanical strength of the substrate, an LED chip is welded to a ceramic substrate with a thicker thickness, and then the ceramic substrate is welded to a metal heat sink, which causes some problems, such that a thermal resistance is increased and the heat of the LED chip is hard to radiate. Embodiments of the present disclosure seek to solve at least one of the problems.

As shown in FIG. 1, the LED support assembly according to embodiments of the present disclosure includes: a metal heat sink 10 defining an upper surface 11 and a lower surface 12; a first ceramic substrate 20 disposed on the upper surface 11 of the mental heat sink 10 to support a LED chip 40; and a second ceramic substrate 30 surrounding the first ceramic substrate 20, i.e. the second ceramic substrate 30 is configured to dispose on the periphery of the first ceramic substrate 20, and supporting positive and negative electrodes 51, 52 of the LED chip 40. The metal heat sink 10 may be a copper heat sink.

In some embodiments, a thickness (i.e. a size in an up-down direction as shown in FIG. 1) of the first ceramic substrate 20 is smaller than that of the second ceramic substrate 30, so that the first and second ceramic substrate 20, 30 define a mounting cavity 70 which is configured as a hollow cup-shaped structure with an open top. An LED chip 40 is adapted to mount into the mounting cavity 70 and support on the first ceramic substrate 20.

More particularly, the thickness of the first ceramic substrate 20 may be substantially 0.1 mm to 0.6 mm, and the thickness of the second ceramic substrate 30 may be substantially 0.6 mm to 5 mm. Thus, the first ceramic substrate 20 with a thinner thickness is used to ensure the performance of heat dissipation, and the second ceramic substrate 30 with a thicker thickness can provide sufficient mechanical strength.

In some embodiments, as shown in FIG. 1, the second ceramic substrate 30 is disposed on the upper surface 11 of the metal heat sink 10 and has a hole 80 penetrating through the second ceramic substrate 30 in a thickness direction (the up-down direction), and the first ceramic substrate 20 is disposed in the hole 80 and a lower surface 22 of the first ceramic substrate 20 is connected to the upper surface 11 of the metal heat sink 10, so that the first ceramic substrate 20 and the hole 80 of the second ceramic substrate 30 form the mounting cavity 70.

More particularly, the first ceramic substrate 20 has a certain shape and size to correspond with the hole 80.

In some embodiments, the first ceramic substrate 20 has an upper surface 21 for mounting the LED chip 40 and a lower surface 22 connected to the upper surface 11 of the metal heat sink 10, and an area of the lower surface 22 is smaller than that of the upper surface 11, so that the heat of LED chip 40 is easily to radiate. Preferably, a sum of the area of the lower surfaces of the first ceramic substrate 20 and the second ceramic substrate 30 is smaller than that of the upper surface 11 of the metal heat sink 10.

In some embodiments, the thermal conductivity of the first ceramic substrate 20 is higher than that of the second ceramic substrate 30. That is to say, the first ceramic substrate 20 disposed into the mounting cavity 70 is more suitable than the second ceramic substrate 30 surrounding the first ceramic substrate 20 for heat dissipation. Thus, the first ceramic substrate 20 is the main element of heat dissipation.

In some embodiments, the coefficient of thermal expansion of the first ceramic substrate 20 is smaller than that of the second ceramic substrate 30. That is to say, the first ceramic substrate 20 disposed in the mounting cavity 70 is harder than the second ceramic substrate 30 surrounding the first ceramic substrate 20 to deform due to the heat from the LED chip 40.

Especially, when the first ceramic substrate 20 is relatively thin, the first ceramic substrate 20 is easily to be broken due to thermal stress, if the coefficient of thermal expansion of the first ceramic substrate 20 is relatively high. Therefore, the coefficient of thermal expansion of the first ceramic substrate 20 is required to be relatively low.

In some embodiments, the strength coefficient of the second ceramic substrate 30 is higher than that of the first ceramic substrate 20. That is to say, the second ceramic substrate 30 surrounding the first ceramic substrate 20 is stronger than the first ceramic substrate 20 disposed in the mounting cavity 70. Thus, the second ceramic substrate 30 can provide sufficient mechanical strength for the LED supporting assembly.

In some embodiments, the first ceramic substrate 20 may be made of a ceramic material with a thin thickness, a high dielectric strength, a low coefficient of thermal expansion, a thermal conductivity and a good weldability with metal, so that the first ceramic substrate 20 may be selected from at least one of the group of aluminum nitride ceramics, zirconium oxide ceramics, and beryllium oxide ceramics.

In some embodiments, the second ceramic substrate 30 may be made of a ceramic material with a thick thickness, a high dielectric strength, a high dielectric strength, a high mechanical strength and a good weldability with metal, so that the second ceramic substrate 30 may be at least one of aluminum nitride ceramics and zirconium oxide ceramics.

As shown in FIG. 1, an LED module according to embodiments of the present disclosure includes the LED support assembly, an LED chip 40, a positive electrode 51, a negative electrode 52 and a sealing material 60.

More particularly, the LED chip 40 is disposed in the mounting cavity 70 of the LED support assembly and supported on the first ceramic substrate 20. The positive electrode 51 and negative electrode 52 are formed on an upper surface 31 of the second ceramic substrate 30 and electrically connected to the LED chip 40 respectively. The sealing material 60 is filled in the mounting cavity 70, so as to encapsulate the LED chip. The sealing resin 60 may include a transparent resin and epoxy fluorescent powder.

As mentioned above, the LED support assembly according to embodiments of the present disclosure, a conflict between the thermal conductivity and the mechanical strength can be solved by the first and second ceramic substrate 20, 30. More specifically, the first ceramic substrate 20 with a thinner thickness can ensure the performance of heat dissipation, and the second ceramic substrate 30 with a thicker thickness is used to reinforce the mechanical strength of the LED supporting assembly. Moreover, the sealing material is easy to be filled into the mounting cavity 70 formed by the first ceramic substrate 20 and the second ceramic substrate 30, so as to improve the quality of the LED chip encapsulation. Finally, the materials of the first and second ceramic substrates can be different, so as to save the cost.

In the following steps, a method of manufacturing the LED module of the present disclosure is introduced.

At step 1, two copper electrodes (the positive and negative electrodes 51, 52) are formed on an upper surface 31 of an aluminum oxide ceramic substrate by methods of HIC and super-energy beam Induced deposition (SBID) which are commonly used methods in the related art. The aluminum oxide ceramic substrate has a thickness of 0.6 mm to 5 mm and the positive copper electrode 51 and negative cooper electrode 52 are formed on a left side and a right side of the aluminum oxide ceramic substrate respectively, as shown in FIG. 1. Then the aluminum oxide ceramic substrate is cut and a hole 80 penetrating through the second ceramic substrate 30 is formed in the aluminum oxide ceramic substrate according to actual needs of the size and the shape of the LED chip 40. Preferably, the hole 80 is form in a center of the aluminum oxide ceramic substrate. Thus, the second ceramic substrate 30 as shown in FIG. 1 is obtained.

At step 2, a copper layer with a thickness of 0.5 µm to 6 µm is formed on the upper surface 21 of an aluminum nitride ceramic with a thickness of 0.1 mm to 6 mm by a method of chemical plating or physical vaporous deposition. After the metallizing treatment, the aluminum nitride ceramic is cut into a thin piece which is corresponding with the shape and size of the hole 80 of the second ceramic substrate 30. Thus, the first ceramic substrate 20 as shown in FIG. 1 is obtained.

At step 3, a copper heat sink is oxidized under a nitrogen atmosphere which containing oxygen of 50-300 ppm for 10 min to 60 min at a temperature from 600° C. to 1000° C., so that the metal heat sink 10 is obtained. Copper has high thermal conductivity and is easy to be welded with ceramic, therefore, the metal heat sink 10 adopts the copper heat sink.

At step 4, the pre-oxidization surface (i.e. the upper surface 11) of the metal heat sink 10 from step 3 is welded to the second ceramic substrate 30 from step 1 by a copper oxide eutectic welding, and then the first ceramic substrate 20 from the step 2 is disposed on the upper surface 11 of the metal heat sink 10 via the hole 80 and the lower surface 22 of the first ceramic substrate 20 which is not metallized is welded to the metal heat sink 10 by the copper oxide eutectic welding, so as to form the mounting cavity 70. It should be noted that, the lower surface 22 of the first ceramic substrate 20 may be formed a thin aluminum oxide layer to improve a wettability with the copper oxide eutectic, when the first ceramic substrate 20 is the aluminum nitride ceramic. Thus, the LED supporting assembly according to embodiments of the present disclosure is obtained.

At step 5, the LED supporting assembly from step 4 is sintered for 5 min to 30 min at a temperature ranging from 1065° C. to 1083° C. under a nitrogen atmosphere.

At step 6, the LED chip 40 is welded to the upper surface 21 of the first ceramic substrate 20 as shown in FIG. 1, and the welding points of the LED chip 40 are electrically connected to the positive and negative electrodes 51, 52 via aurum wires.

At step 7, epoxy fluorescent powder and a transparent sealing resin are filled into the mounting cavity 70 to encapsulate the LED chip 40.

At step 8, a lower surface 12 of the metal heat sink 10 is welded to a cooling device.

Embodiment 1

Positive and negative copper electrodes 51, 52 are printed on an upper surface of an aluminum oxide ceramic substrate with a thickness of 1 mm, next, the aluminum oxide ceramic substrate is sintered at a temperature of 1100° C. under a nitrogen atmosphere and then cut into a column with a diameter of 2.5 mm, next, the aluminum oxide ceramic substrate in a shape of column is punched out to form a hole 80 with a diameter of 1 mm at a center of the aluminum oxide ceramic substrate, so that a second ceramic substrate 30 as shown in FIG. 1 is prepared.

A copper layer with a thickness of 2 µm is formed on an upper surface of an aluminum oxide ceramic substrate with a thickness of 0.25 mm by chemical plating, and then the aluminum oxide ceramic substrate is cut into a circular piece with a diameter of 1 mm, so that a first ceramic substrate 20 as shown in FIG. 1 is prepared.

A copper heat sink is oxidized under a nitrogen atmosphere which containing oxygen of 300 ppm for 30 min at a temperature of 600° C., so that a copper heat sink 10 as shown in FIG. 1 is prepared.

A surface of the second ceramic substrate 30 without the positive and negative electrodes 51 and 52, i.e. the lower 32 surface of the second ceramic substrate 30, is welded to a oxidized surface of the copper heat sink 10, i.e. the upper surface 11 of the copper heat sink 10, then the first ceramic substrate 20 is disposed on the upper surface 11 of the copper heat sink 10 via the hole 80 of the second ceramic substrate 30 and a surface without metallizing, i.e. the lower surface 22 of the first ceramic substrate 20, is welded to the upper surface 11. Thus, the LED supporting assembly is prepared.

The LED supporting assembly is sintered for 10 min at a temperature of 1072° C. under a nitrogen atmosphere.

A LED chip 40 with a power of 5 W is welded to the upper surface 21 of the first ceramic substrate 20 by copper oxide eutectic welding, and the welding points of LED chip 40 are electrically connected to the positive and negative electrodes 51, 52.

Finally, epoxy fluorescent powder and a transparent sealing resin are filled into the mounting cavity 70 to encapsulate the LED chip 40, and then a lower surface 12 of the metal heat sink 10 is welded to a cooling device, so that a final product P1 is prepared.

Embodiment 2

Positive and negative copper electrodes 51, 52 are printed on an upper surface of an aluminum oxide ceramic substrate with a thickness of 2 mm, next, the aluminum oxide ceramic substrate is sintered at a temperature of 1100° C. under a nitrogen atmosphere and then cut into a column with a diameter of 2.5 mm, next, the aluminum oxide ceramic substrate in a shape of column is punched out to form a hole 80 with a diameter of 1 mm at a center of the aluminum oxide ceramic substrate, so that a second ceramic substrate 30 as shown in FIG. 1 is prepared.

An aluminum nitride ceramic with a thickness of 0.38 mm is oxidized in the air for 30 min at a temperature of 1100° C. A copper layer with a thickness of 2 μm is formed on an upper surface of the aluminum nitride ceramic substrate by chemical plating, and then the aluminum nitride ceramic substrate is cut into a circular piece with a diameter of 1 mm, so that a first ceramic substrate 20, made of aluminum nitride ceramic which is different from the material of the second ceramic substrate 30, is prepared.

A copper heat sink is oxidized under a nitrogen atmosphere which containing oxygen of 300 ppm for 30 min at a temperature of 600° C., so that a copper heat sink 10 as shown in FIG. 1 is prepared.

A surface of the second ceramic substrate 30 without the positive and negative electrodes 51 and 52, i.e. the lower 32 surface of the second ceramic substrate 30, is welded to a oxidized surface of the copper heat sink 10, i.e. the upper surface 11 of the copper heat sink 10, then the first ceramic substrate 20 is disposed on the upper surface 11 of the copper heat sink 10 via the hole 80 of the second ceramic substrate 30 and a surface without metallizing, i.e. the lower surface 22 of the first ceramic substrate 20, is welded to the upper surface 11. Thus, the LED supporting assembly is prepared.

The LED supporting assembly is sintered for 10 min at a temperature of 1072° C. under a nitrogen atmosphere.

A LED chip 40 with a power of 5 W is welded to the upper surface 21 of the first ceramic substrate 20 by copper oxide eutectic welding, and the welding points of LED chip 40 are electrically connected to the positive and negative electrodes 51, 52.

Finally, epoxy fluorescent powder and a transparent sealing resin are filled into the mounting cavity 70 to encapsulate the LED chip 40, and then a lower surface 12 of the metal heat sink 10 is welded to a cooling device, so that a final product P2 is prepared.

Comparative Embodiment 1

Two Electrodes are Formed on a Two-Sided Aluminum Oxide Direct Bonding Copper (DBC) substrate with a ceramic thickness of 0.3 mm and a copper thickness of 0.1 mm by pasting, exposuring, developing, and etching. Then the DBC substrate is cut into a packing support with a diameter of 2.5 mm, and a LED chip with a power of 5 W is mounted onto the copper-coated surface of the DBC substrate, and the LED chip is connected to the electrodes on the surface of the ceramic by aurum wires. An overflow wall for preventing an epoxy resin from overflow is provided, so that the fluorescent powder and epoxy resin are collected within the overflow wall, then the other side of the DBC substrate is connected with a cooling device. Thus, a final product P3 is prepared.

Performance Test

The final products according to EMBODIMENTS 1-2 and COMPARING EMBODIMENT 1 are tested by freely dropping them from a height of 1.5 m vertically to the ground. Then to observe if the final products have any crack or damage, the dropping test will be continued to carry out if there is no crack or damage occurring on the final products. However, if there is any crack or damage occurring on the final product, the dropping test relative to the final product will be stopped and the number of the dropping test will be recorded for the final product. Moreover, the final products P1, P2, and P3 are tested by a junction temperature test of LED: a temperature measurement point of a K-type thermocouple is set on a cooling pad, the temperature of the cooling pad is recorded as Tc, since $Tj=Rjc*P+Tc$ (Rjc is the thermal resistance parameter of the LED chip, P is the power converting into heat), so that a junction temperature (Tj) is obtained.

Results of the junction temperature test of LED are shown in Table 1.

TABLE 1

|  | P1 | P2 | P3 |
| --- | --- | --- | --- |
| Number of dropping | 28 | 42 | 6 |
| Tj (° C.) | 92 | 68 | 126 |

It can be seen from the Table 1 results that, the LED module according to embodiment of the present invention has an excellent mechanical strength and a good thermal conductance.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. An LED support assembly, comprising:
   a metal heat sink defining an upper surface and a lower surface;
   a first ceramic substrate configured to support an LED chip and disposed on the upper surface of the metal heat sink; and
   a second ceramic substrate configured to support electrodes of the LED chip and surrounding the first ceramic substrate.

2. The LED support assembly of claim 1, wherein the second ceramic substrate defines a hole penetrating through the second ceramic substrate in a thickness direction thereof, the first ceramic substrate is disposed in the hole and a mounting cavity is defined by the first and second ceramic substrates.

3. The LED support assembly of claim 1, wherein a thickness of the first ceramic substrate is smaller than a thickness of the second ceramic substrate.

4. The LED support assembly of claim 3, wherein the thickness of the first ceramic substrate ranges from 0.1 mm to 0.6 mm, and the thickness of the second ceramic substrate ranges from 0.6 mm to 5 mm.

5. The LED support assembly of claim 1, wherein the first ceramic substrate comprises a lower surface, wherein an area of the lower surface of the first ceramic substrate is smaller than an area of the upper surface of the metal heat sink.

6. The LED support assembly of claim 1, wherein the second ceramic substrate is disposed on the upper surface of the metal heat sink.

7. The LED support assembly of claim 6, wherein a sum of an area of a lower surface of the first ceramic substrate and a lower surface of the second ceramic substrate is smaller than an area of the upper surface of the metal heat sink.

8. The LED support assembly of claim 1, wherein a thermal conductivity of the first ceramic substrate is higher than a thermal conductivity of the second ceramic substrate.

9. The LED support assembly of claim 1, wherein a coefficient of thermal expansion of the first ceramic substrate is lower than a coefficient of thermal expansion of the second ceramic substrate.

10. The LED support assembly of claim 1, wherein a strength coefficient of the first ceramic substrate is lower than a strength coefficient of the second ceramic substrate.

11. The LED support assembly of claim 1, wherein the first ceramic substrate comprises at least one of aluminum oxide ceramics, aluminum nitride ceramics, zirconium oxide ceramics, and beryllium oxide ceramics.

12. The LED support assembly of claim 1, wherein the second ceramic substrate comprises at least one of aluminum nitride ceramics and zirconium oxide ceramics.

13. The LED support assembly of claim 1, wherein the metal heat sink comprises a copper heat sink.

14. An LED module, comprising:
   the LED support assembly of claim 1;
   an LED chip supported on the first ceramic substrate of the LED support assembly;
   a positive electrode and a negative electrode, each supported on the second ceramic substrate and electrically connected to the LED chip; and
   a sealing material encapsulating the LED chip.

* * * * *